United States Patent [19]

Nagahama

[11] 4,062,013

[45] Dec. 6, 1977

[54] NON-LINEAR TYPE DIGITAL-TO-ANALOG CONVERTER

[75] Inventor: Yasuo Nagahama, Hamamatsu, Japan

[73] Assignee: Nippon Gakki Seizo Kabushiki Kaisha, Japan

[21] Appl. No.: 624,187

[22] Filed: Oct. 20, 1975

[30] Foreign Application Priority Data

Oct. 24, 1974 Japan .............................. 49-121957

[51] Int. Cl.² ........................................... H03K 13/02
[52] U.S. Cl. ........................ 340/347 DA; 340/347 M; 84/1.24; 364/857
[58] Field of Search ................ 340/347 DA; 235/197; 84/1.24, 1.26

[56] References Cited

U.S. PATENT DOCUMENTS

| 3,832,707 | 8/1974 | Buchanan et al. | 340/347 DA |
| 3,886,834 | 6/1975 | Okamoto | 84/1.24 X |
| 3,905,028 | 9/1975 | Wintz et al. | 340/347 AD |
| 3,943,466 | 3/1976 | Lyghounis | 340/347 AD |
| 3,984,829 | 10/1976 | Zwack | 340/347 C |

OTHER PUBLICATIONS

Harrison, "Logarithmic Digital to Analog Converter," IBM Technical Disclosure Bulletin, vol. 5, No. 5, 10/1962, pp. 30, 31.
Analog Devices, Inc., "Analog-Digital Conversion Handbook," 6/1972, pp. II-36 to II-38.
Landee et al., "Electronic Designers" Handbook, McGraw-Hill Book Co., 1957, pp. 23-31.
Analog Devices, Inc., Analog-Digital Conversion Handbook, 6/1972, pp. I-2 to I-5; III-18 to III-42.

Primary Examiner—Thomas J. Sloyan
Attorney, Agent, or Firm—Robert E. Burns; Emmanuel J. Lobato; Bruce L. Adams

[57] ABSTRACT

A non-linear type digital-to-analog converter comprising a decoder, control switching circuits controlled respectively by the outputs of the decoder, and an exponential function generating circuit whose analog outputs are selectively produced by the operation of the control switching circuits. An input digital representation is converted to an analog voltage output which is exponentially related to the input.

5 Claims, 5 Drawing Figures

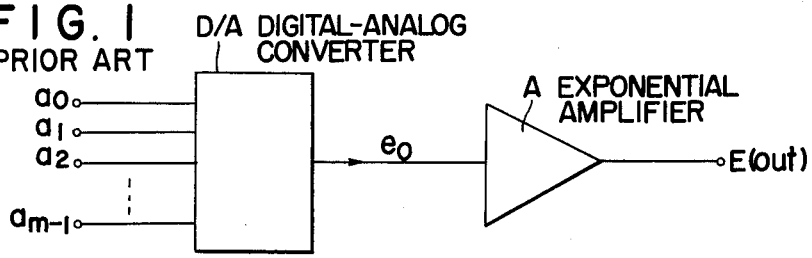
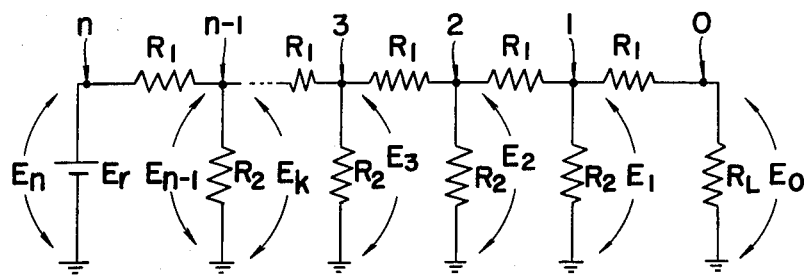
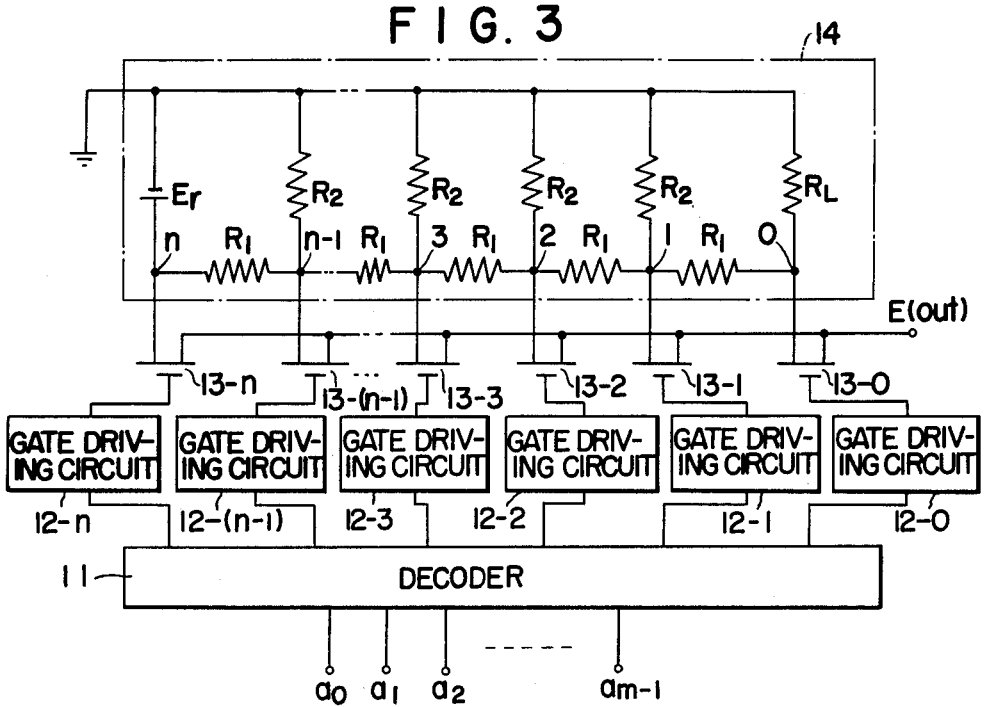

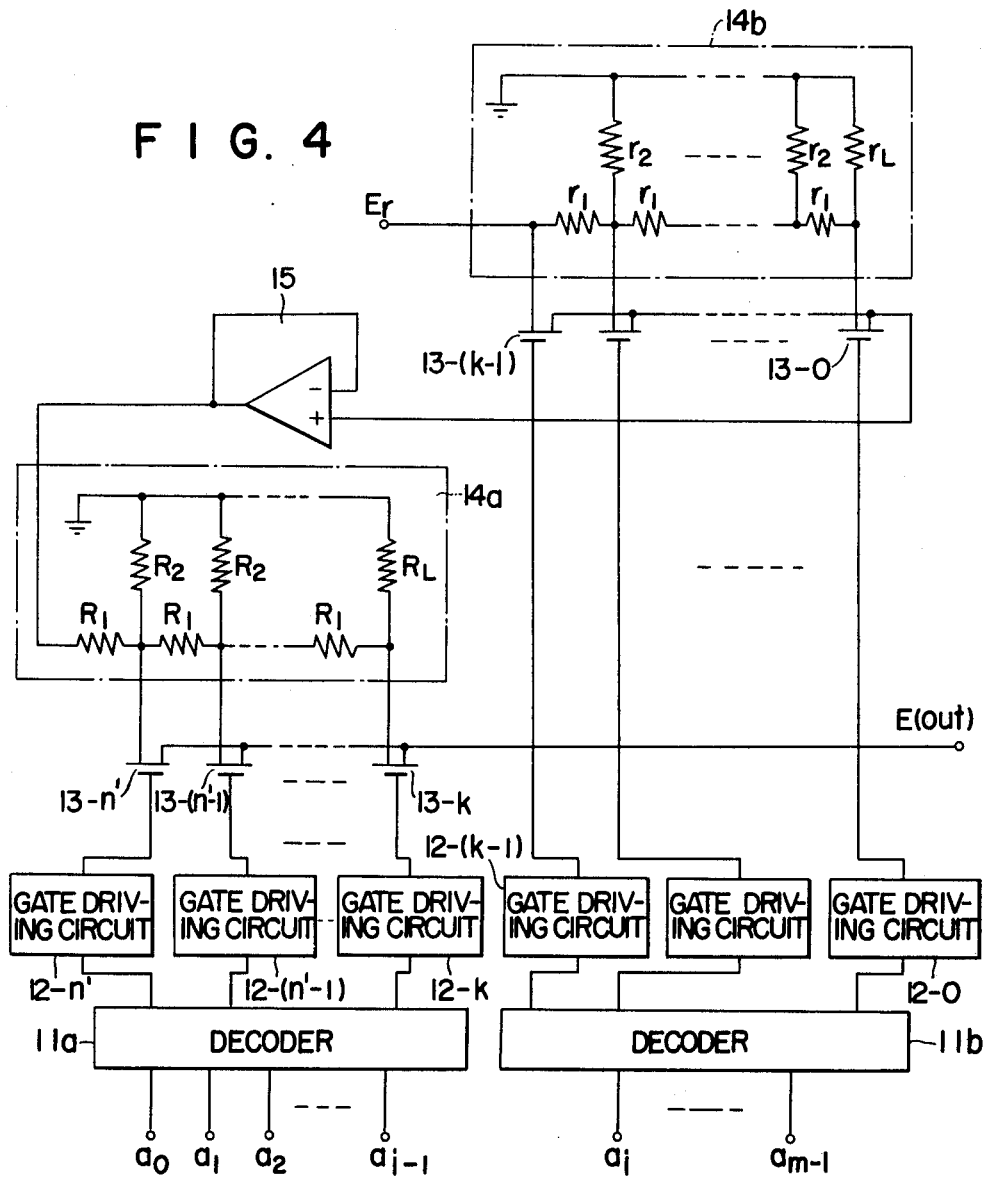
F I G. 4

NON-LINEAR TYPE DIGITAL-TO-ANALOG CONVERTER

BACKGROUND OF THE INVENTION

This invention relates to non-linear type digital-to-analog converters effectively employable for obtaining pitch determining voltage signals in electronic musical instruments in which, for instance, voltage-controlled oscillators are employed as tone generators, and more particularly to a non-linear type digital-to-analog converter capable of producing an exponential function output having, as its exponent, a value corresponding to a digital input signal applied thereto.

In general, there are many cases in which the provision of an exponential function output having, as its exponent, a value corresponding to a digital input signal is required. For instance, in an electronic musical instrument employing a voltage-controlled oscillator as its tone generator it is necessary to control the voltage-controlled oscillator by the use of such an exponential function output as described above in order to obtain pitch determining voltage signals.

In order to meet this requirement, a digital-to-analog converter such as shown in FIG. 1. has been proposed. In this conventional digital-to-analog converter, a binary-coded input signal ranging from the least significant digit $a_o$ to the most significant digit $a_{m-1}$ (which is keying information, for instance, $m=6$ in case of 61 keys) is converted into an analog signal $e_o$ by a digital-to-analog conversion circuit D/A, and the analog signal thus obtained is introduced to a voltage-controlled oscillator through an exponential amplifier A. In this operation, the output $e_o$ is represented by $e_o = M_1(a_o \times 2^o + a_1 \times 2^1 \cdots + a_{m-1} \times 2^{m-1})$, and the output $E(out)$ of the amplifier A is represented by $E(out) = M_2(M_3 e_o)$. In these equations, $M_1$, $M_2$ and $M_3$ are the circuit constants, and each of $a_o$, $a_1$, . . . , $a_{m-1}$ is either 0 or 1.

However, the conventional digital-to-analog converter is accompanied by the following difficulties:

1. Since the accuracy of the least significant bit in the conversion circuit 1 is ±50%, the conversion error of the converter is increased in the case when the number of bits is small, although the conversion accuracy thereof may be high in the case of full scale.

2. The exponential function characteristic of a transistor or a diode is, in general, utilized for the exponential operation of the exponential amplifier A, and therefore not only the operational accuracy but also the operational speed thereof cannot be as high as expected. This difficulty is due to the thermal characteristics of circuit elements such as those described above and to a noise signal of the order of 10μV caused therein; that is, the difficulty is due to the fact that the operating characteristic of the amplifier, or the transistor or the diode is limited.

SUMMARY OF THE INVENTION

Accordingly, an object of this invention is to provide a non-linear type digital-to-analog converter in which all of the above-described difficulties accompanying a conventional digital-to-analog converter are overcome.

More specifically, an object of the invention is to provide a non-linear type digital-to-analog converter which produces an exponential function output having, as its exponent, a value corresponding to an input digital data signal applied thereto, without the use of an exponential amplifier.

Another object of the invention is to provide a non-linear type digital-to-analog converter having high accuracy and high operating speed.

A further object of the invention is to provide a non-linear type digital-to-analog converter having a low noise characteristic.

A still further object of the invention is to provide a non-linear type digital-to-analog converter whose output has a low distortion factor even if a large input signal is applied thereto.

The foregoing objects and other objects are achieved, according to this invention, by the provision of a non-linear type digital-to-analog converter for producing an exponential function output having, as its exponent, a value corresponding to an digital input signal applied thereto, comprising:

a. decoder means having digital inputs and individual outputs for decoding said digital input signal to an individual output signal;

b. exponential function generating means provided with output points whose number corresponds to the number of the individual outputs of said decoder means, for providing respectively at said output points analog outputs which are stepwisely different in value; and c. control switching means comprising a plurality of control switching circuits connected respectively to said output points of said exponential function generating means and to the individual outputs of the decoder so that, in response to an enabled individual outputs produced by said decoder means, said analog outputs provided at said output points of said exponential function generating means are selectively introduced to a common output terminal.

The nature, utility and principle of this invention will be more clearly understood from the following detailed description and the appended claims when read in conjunction with the accompanying drawings in which like parts are designated by like numerals or characters.

BRIEF DESCRIPTION OF THE DRAWINGS

In the accompanying drawings:

FIG. 1 is a block diagram illustrating a conventional digital-to-analog converter for generating exponential functions;

FIG. 2 is a circuit diagram showing the theoretical configuration of an exponential function generating circuit employed in this invention;

FIG. 3 is a circuit diagram illustrating one example of a non-linear type digital-to-analog converter for generating exponential function outputs;

FIG. 4 is a circuit diagram illustrating a modification of the digital-to-analog converter according to the invention.

DETAILED DESCRIPTION OF THE INVENTION

Figure 5:
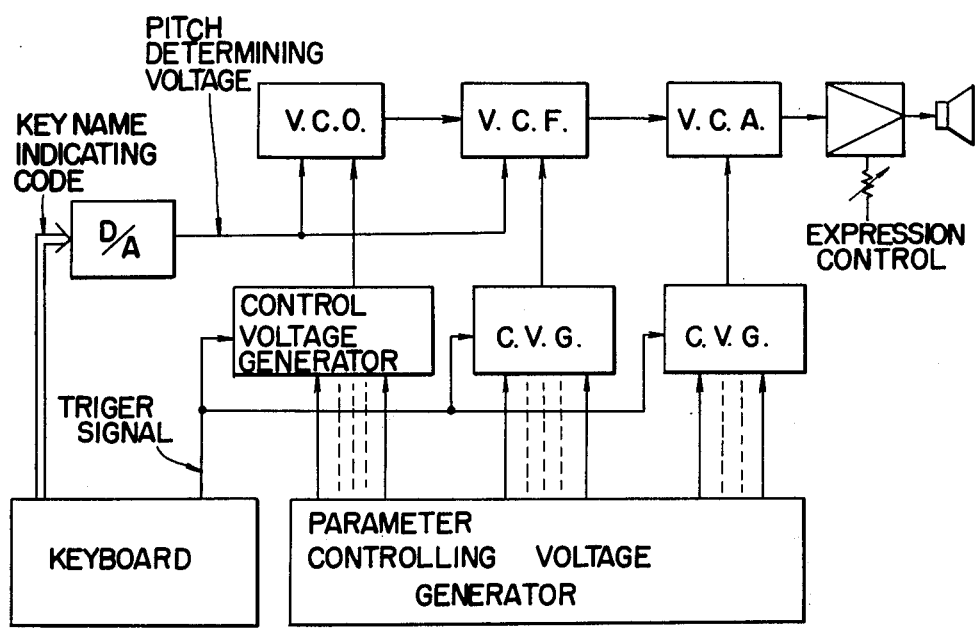
FIG. 5 is a block diagram of an electronic musical instrument including a digital-to-analog converter of the present invention.

An example of an exponential function generating circuit employed in this invention is shown in FIG. 2.

This circuit is formed by resistors $R_1$, $R_2$ and $R_L$ which are connected to a constant d.c. voltage source Er (of a voltage Er) in the form of a ladder network as is shown in FIG. 2. More specifically the exponential function generating circuit is formed by the following steps: First, a series circuit of resistors $R_1$ having connection points $n-1$, $n-2$, . . . 3, 2 and 1 therebetween is formed, and resistors $R_2$ are connected to the connection points $n-1, n-2, \ldots 3, 2$ and $1$ of the series circuit of the resistors $R_1$, respectively. The free end of the resistors $R_2$ are grounded. The free end of the resistor $R_1$ at one end of the series circuit is connected to the positive terminal (or connection point) $n$ of the d.c. source $Er$ having its negative terminal grounded. The free end of the resistor $R_1$ at the other end of the series circuit is connected to one end (or connection point $0$) of the resistor $R_L$ having the other end grounded.

Thus, the exponential function generating circuit has the connection points $0$ through n, and output voltages $E_o$ through $E_n$ are obtained between the connection points $0$ through n and the ground, respectively.

If the values of the resistors $R_1$, $R_2$ and $R_L$ employed in the exponential function generating circuit are selected so as to satisfy the equation of $R_2 = R_L(1 + R_L/R_2)$, a voltage $Ek$ at any stage, that is, between any connection point and the ground, can be represented by the following equation because $En = Er$.

$$Ek = Er(R_L/R_1 + R_L)n - k$$

where $k$ is an integer from $0$ through $n$. Thus, a sequence of voltages which increase in a stepwise monotonic manner are obtained at the respective connection points $0 - n$. More specifically, the voltage at the point $1$ is greater than that at the point $0$, the voltage at the point $2$ is greater than that at the point $1$, and so on.

When the circuit shown in FIG. 2 is employed in one example of the invention described later, these connection points $0 - n$ serve as output points, the number of which is selected to equal a value obtained by raising the base of a binary coded signal or a digital input signal (the base being "2" in the case of binary number) to a power equal to the number ($m$) of bits in the binary coded signal. That is, in the case of an m bit binary number, the number of the connection points is $2^m$, and the voltages $Eo - En$ obtained respectively at the connection points are $2^m$ different voltages which increase in a stepwise monotonic manner.

FIG. 3 shows one example of a non-linear type digital-to-analog converter according to this invention which includes a ladder-type function generating circuit as shown in FIG. 2.

The non-linear type digital-to-analog converter comprises: a decoder $11$ operating to receive a binary coded input signal of digital data ranging from the least significant digit $a_o$ to the most significant digit $a_{m-1}$ and to produce $2^m (n+1 = 2^m)$ individual outputs by decoding the binary coded input signal; and a ladder-type function generating circuit $14$ such as shown in FIG. 2. The individual outputs produced by the decoder $11$ are applied through gate driving circuits $12$-$0$ through $12$-$n$ to the control terminals of control switching means, that is, the gates of field-effect transistors $13$-$o$ through $13$-$n$, respectively. The field-effect transistors are connected to the output points $o$ through $n$ of the function generating circuit $14$, respectively, and produce outputs $E$(out) at their common output terminal $E$(out) in response to the gate input signals produced by the gate driving circuits. For instance, when the control switching means $13$-$n$ is rendered conductive, the output $E$(out) $= Er$ is delivered to the output terminal $E$(out).

In the exponential function generating circuit illustrated in FIG. 2, the output $E$(out) is expressed by the following Equation (1):

$$E(\text{out}) = Er \times (R_L/R_1+R_L)^{n-(a_{m-1}\times 2^{m-1}+\ldots a_1 \times 2^1 + a_0 \times 2^0)} \quad (1)$$

If in order to simplify Equation (1), $R_L/(R_1+R_L)$ is made equal to $K$ $(R_L/(R_1+R_L)=K)$, then Equation (1) can be rewritten as in the following Equation (2):

$$E(\text{out}) = Er \times K^{n-(a_{m-1}\times 2^{m-1}+\ldots+a_1\times 2^1+a_0\times 2^0)} \quad (2)$$

Thus, an exponential function output having, as its exponent, a value corresponding to a digital input signal is obtained. Accordingly, it is apparent that the non-linear type digital-to-analog converter according to the invention can be employed in place of the converter D/A plus the exponential amplifier A shown in FIG. 1, so as to effectively drive the voltage-controlled oscillator in the electronic musical instrument.

A modification of the converter shown in FIG. 3, as illustrated in FIG. 4, is similar to that of FIG. 3 in signal transmitting characteristic but is different in that, in order to reduce the complexity in circuit configuration accompanying the increase of the number of outputs in the ladder type function generating circuit and also in the decoder, these outputs are divided into a plurality of groups (two groups in FIG. 4).

More specifically, the digital-to-analog converter, as shown in FIG. 4, comprises two decoders $11a$ and $11b$, and two function generating circuits $14a$ and $14b$. An output read through control switching means $13$-$0$ through $13$-$(k-1)$ out of the function generating circuit $14b$ is applied through a buffer amplifier $15$ to the function generating circuit $14a$.

The decoder $11a$ operates to receive a binary coded input signal ranging from the least significant digit $a_o$ to the $i$-th digit $a_{i-1}$ and produce $2^i$ outputs which are applied to control the control switching circuits $13$-$k$ through $13$-$n'$ through gate driving circuits (amplifiers) $12$-$k$ through $12$-$n'$, respectively. On the other hand, the decoder $11b$ receives a binary coded input signal ranging from the $a_i$-th digit to the most significant digit $a_{m-1}$ to produce outputs which control the control switching circuits $13$-$0$ through $13$-$(k$-$1)$ through gate driving circuits $12$-$0$ through $12$-$(k$-$1)$.

During the operations, one output is produced by each of the decoders $11a$ and $11b$, and therefore a control switching circuit of the function generating circuit $14a$ and a control switching circuit of the function generating means $14b$ are rendered conductive, respectively, as a result of which, an output $E$(out) is produced and delivered to the common output terminal $E$(out).

In the circuit shown in FIG. 4, if the values of the resistors $R_1$, $R_2$ and $R_L$, and $r_1$, $r_2$ and $r_L$ are determined so as to satisfy the following equations:

$$R_2 = R_L(1+R_L/R_1)), \text{ and } r_2 = r_L(1+(r_L/r_1)),$$

the output $E$(out) can be expressed by the following equation (3):

$$E(\text{out}) = E_r \times K_1^{(k-1)\cdot(a_{m-1}\times 2^{m-i-1}+a_{m-2}\times 2^{m-i-2}\ldots+a_1\times 2^0)} \times K^{(n'-k+1)\cdot(a_{i-1}\times 2^{i-1}+a_{i-2}\times 2^{i-2}+\ldots+a_0\times 2^0)} \quad (3)$$

where
$K = R_L/(R_1 + R_2)$,
$K_1 = r_L/(r_1 + r_L)$, and
$K = K_1^{2-i}$

This Equation (3) can be rewritten as in the following Equation (4):

$$E(\text{out}) = Er \times K^{n'-k+1+2^i(k-1)} \times K^{-(a_{m-1}\times 2^{m-1}+a_{m-2}\times 2^{m-2}+\ldots+a_0\times 2^0)} \quad (4)$$

This Equation (4) corresponds to the above Equation (2), and therefore it is apparent that the signal transmitting characteristic of the converter shown in FIG. 4 corresponds to that of the converter shown in FIG. 3.

A merit of the converter organized as shown in FIG. 4 is that circuit configuration per decoder and that per ladder-type function generating circuit can be simplified when compared with the converter shown in FIG. 3.

The following advantageous features are provided by the converter according to this invention as described above with respect to certain embodiments thereof.

1. Without employing an exponential amplifier, the converter according to this invention can produce an exponential function output having, as its exponent, a value corresponding to an input digital data signal.

2. Since a linear conversion circuit and an exponential amplifier are not employed in the converter according to the invention, high accuracy (0.1% with the minimum number of bits) and high speed operation can be obtained.

3. By the converter of this invention, an accurate attenuation ratio can be controlled in a digital mode, and therefore the converter can be used also as an attenuator.

4. Impedances viewed from the output points of the ladder type function generating circuit are equal, and accordingly variations in level will not change the absolute value of input thermal noise. Thus, the converter according to this invention has a low-noise characteristic.

5. The field-effect transistor employed as the control switching circuit in the converter according to the invention is operated in an on-off switching mode. Therefore, even if a large input signal is applied to the converter, the resultant output has a low distortion factor.

The digital-to-analog converter according to this invention can be suitably employed in a synthesizer type electronic musical instrument as shown in FIG. 5. A keyboard produces digital code signals representing key names. Other portions are known in this field by prior patents and actual models on sale.

What is claimed is:

1. A non-linear type digital-to-analog converter for producing an exponential function output having, as its exponent, a value corresponding to an input digital signal applied thereto, comprising
   a. decoder means, having a plurality of inputs for receiving digital input signals and individual output ports for developing individual output signals, for decoding said digital input signal to develop an individual output signal corresponding to an applied digital input signal;
   b. exponential function generating means, comprising a DC voltage source having a grounded terminal and an ungrounded terminal, a series circuit of first resistors having the same resistance value $R_1$ and connected in series to define connecting nodes equal to the number of individual outputs of said decoder means between respective pairs of said first resistors, wherein one end of said series circuit is connected to said ungrounded terminal, second resistors having the same resistance valve $R_2$ wherein each of said second resistors is connected between a respective connecting node of said series circuit and ground, and a third resistor having a resistance value $R_L$ connected between another end of said series circuit and ground, wherein said first second and third resistors having values satisfying the equation $R_2 = R_L(1+(R_L/R_1))$ for providing at respective ones of said connecting nodes analog outputs of stepwise exponentially differing values; and
   c. control switching means including a common output terminal and comprising a plurality of control switching circuits connected respectively to said connecting nodes of said exponential function generating means and to said individual outputs of the decoder so that, in response to an individual analog output of said decoder means, said analog outputs provided at said output points of said exponential function generating means are selectively applied to said common output terminal in accordance with the applied digital input signal.

2. A converter as claimed in claim 1, in which said control switching circuit is a field-effect transistor.

3. The converter as claimed in claim 1 which further comprises gate driving circuits connected between said control switching circuits and said decoder means, for receiving said individual outputs of said decoder means to control respective ones of said control switching circuits, respectively.

4. A non-linear type digital-to-analog converter for producing an exponential function output having, as its exponent, a value corresponding to an input digital signal applied thereto, comprising
   decoder means, having a plurality of inputs for receiving digital input signals and individual output ports for developing individual output signals, for decoding said digital input signal to develop an individual output signal corresponding to an applied digital input signal;
   exponential function generating means provided with output points whose number corresponds to the number of the individual outputs of said decoder means for providing at respective ones of said output points analog outputs of stepwise exponentially differing values; and
   control switching means including a common output terminal and comprising a plurality of control switching circuits connected respectively to said output points of said exponential function generating means and to said individual outputs of the decoder so that, in response to an individual analog output of said decoder means, said analog outputs provided at said output points of said exponential function generating means are selectively applied to said common output terminal in accordance with the applied digital input signal; wherein
   said decoder means comprises at least two decoders, the first of which is connected to decode a part of said digital input signal, and the second of which is connected to decode the other part of said digital input signal;
   said exponential function generating means comprises at least two exponential function generating circuits;
   the first of the two exponential function generating circuits is provided with output points whose number corresponds to a number of first individual outputs of said first decoder for providing at respective ones of said output points of said first exponential function generating circuit analog outputs of stepwise exponentially differing values;

the second exponential function generating circuit is provided with output points whose number corresponds to a number of second individual outputs of said second decoder for providing at respective ones of said output points of said second exponential function generating circuit analog outputs of stepwise exponentially differing values;

said control switching means comprises at least first and second groups of control switching circuits;

said control switching circuits of the first group are connected to said output points of said first exponential function generating circuit and to said first individual outputs so that, in response to an individual output of said first decoder, said analog outputs provided at said output points of said first exponential function generating circuit are selectively applied to said second exponential function generating circuit; and said control switching circuits of the second group are connected to said output points of said second exponential function generating circuit and to said second individual outputs so that, in response to an individual output signal of said second decoder said analog outputs provided at said output points of said second exponential function generator are selectively introduced to the common output terminal.

5. A converter as claimed in claim 4, which further comprises a buffer amplifier connected between said first and second exponential function generating circuits, for delivering an analog output provided by said first exponential function generating circuit to said second exponential function generating circuit.

* * * * *

UNITED STATES PATENT AND TRADEMARK OFFICE
CERTIFICATE OF CORRECTION

PATENT NO. : 4,062,013
DATED : December 6, 1977
INVENTOR(S) : Yasuo Nagahama

It is certified that error appears in the above-identified patent and that said Letters Patent is hereby corrected as shown below:

Col. 1 line 36: delete "$M_2(M_3e_0)$"

and insert --$M_2^{(M_3e_0)}$

Col. 3 line 13: delete "$R_L/R_2)$"

and insert --$R_L/R_1)$--

Col. 3 line 21: delete "$Ek=Er(R_L/R_1+R_L)n-k$"

and insert --$Ek=Er(R_L/R_1+R_L)^{n-k}$--

Col. 4 line 54: delete "$R_2=R_L(1+R_L/R_1))$ and $r_2=r_L(1+(r_L/r_1))$"

and insert --$R_2=R_L(1+R_L/R_1)$ and $r_2=r_L(1+r_L/r_1)$--

Col. 6 line 3 delete "$R_2=R_L(1+(R_L/R_1)$"

and insert --$R_2=R_L(1+R_L/R_1)$--

Signed and Sealed this

Ninth Day of May, 1989

Attest:

DONALD J. QUIGG

Attesting Officer

Commissioner of Patents and Trademarks